United States Patent [19]

Tsutsui et al.

[11] Patent Number: 5,504,352
[45] Date of Patent: Apr. 2, 1996

[54] SEMICONDUCTOR MESFET DEVICE WITH EDGE PORTION

[75] Inventors: Hiroaki Tsutsui; Akira Mochizuki, both of Tokyo, Japan

[73] Assignee: NEC Corporation, Tokyo, Japan

[21] Appl. No.: 347,154

[22] Filed: Nov. 22, 1994

[30] Foreign Application Priority Data

Dec. 28, 1993 [JP] Japan .................... 5-337916

[51] Int. Cl.$^6$ .................... H01L 29/80; H01L 31/112
[52] U.S. Cl. .................... 257/194; 257/280; 257/281; 257/283; 257/284
[58] Field of Search .................... 257/284, 283, 257/281, 280, 194

[56] References Cited

U.S. PATENT DOCUMENTS 4,160,984  7/1979  Ladd, Jr. et al. .................... 257/284

FOREIGN PATENT DOCUMENTS 64-61067    3/1989  Japan .
1302771    12/1989  Japan .................... 257/284
3038046     2/1991  Japan .................... 257/284
5206171     8/1993  Japan .................... 257/284

OTHER PUBLICATIONS

Gaensslen et al, "Fully Self–Aligned MESFET Structure", IBM Technical Disclosure Bulletin, vol. 22, No. 9, Feb. 1980, pp. 4254–4255.

Primary Examiner—William Mintel
Attorney, Agent, or Firm—Young & Thompson

[57] ABSTRACT

In a recessed structure MESFET, an active layer (n-type layer) 2 is provided on a high resistance GaAs substrate 1, a pair of contact layers (n$^+$-type layers) 31, 32 is provided on the active layer 2, a source electrode 6 is provided on one contact layer 31, a drain electrode 7 is provided on the other contact layer 32 and a gate electrode 5 is provided on the active layer 2 to achieve a recessed structure. A semiconductor layer 4 having a lower impurity density than that of the contact layer 31, 32 is formed at the recess edge portion at at least drain side to alleviate the concentration of the electric field and current there to suppress the generation of electron-holes pairs by collision ionization to reduce the damage to the crystal lattice by non-luminescence recombination of the electron-holes thus preventing the degradation of the FET characteristics.

4 Claims, 3 Drawing Sheets

SEMICONDUCTOR MESFET DEVICE WITH EDGE PORTION

FIELD OF THE INVENTION

The present invention relates to a semiconductor device and, in particular, to a recess type MESFET (Metal Semiconductor Field Effect Transistor).

BACKGROUND OF THE INVENTION

Conventionally, this type of MESFET, as shown in FIG. 1, has an active layer (n-type layer) 2 on a GaAs substrate 1 having a high resistance, and a pair of contact layers ($n^+$-type layers) 31, 32 are formed on the active layer 2. On one contact layer ($n^+$-type layer) 31, a source electrode 6 is provided and, on the other contact layer ($n^+$-type layer) 32, a drain electrode 7 is provided, and a gate electrode 5 is provided on the active layer (n-type layer) 2 between the pair of contact layers ($n^+$-type layers) 31, 32 to form a recessed structure.

That is, the foregoing MESFET, in order to reduce the parasitic resistance, adopts a recessed structure in which the thickness of the active layer (n-type layer) of the source and drain areas is made greater than that of the active layer (n-type layer) below the gate electrode while the contact layer ($n^+$-type layer) is formed on the active layer of the source and drain areas.

On the other hand, in order to improve the gate-drain reverse breakdown voltage $BV_{GD}$ of the MESFET, there is a case in which a semiconductor layer having a reduced impurity density is formed at a portion nearer to the gate electrode between the gate and the drain to alleviate the concentration of the electric field around the gate edge (See Japanese Patent Appln. Laid-Open No. 64-61067).

FIG. 2 illustrates this type structure. The MESFET has the active layer (n-type layer) 2 on the high resistance GaAs substrate 1, and the source electrode 6 and the drain electrode 7 are disposed on the active layer 2, on which the gate electrode 5 is disposed between the source electrode 6 and the drain electrode 7. A semiconductor layer ($n^-$-type layer) 4 having an impurity density lower than that of the active layer (n-type layer) 2 is formed at an area on the active layer 2 below an edge portion of the gate electrode 5.

However, in the foregoing conventional recessed type MESFET shown in FIG. 1, when the drain voltage is very high, the concentration of the electric field occurs in the active layer at the surface side near the drain side recess edge rather than the substrate side. That is, although, within the recess, the potential lies on the high level supported by the gate potential and the substrate potential, it is abruptly lowered in the neighborhood of the drain side recess edge toward the contact layer ($n^+$-type layer), and therein the intensity of the electric field becomes great.

Further, since the potentials of the drain electrode and the drain side contact layer ($n^+$-type layer) of the surface side become lower than the potential at the substrate side, channel stricture occurs and the current is concentrated toward the neighborhood of the surface, i.e. the drain side recess edge. That is, the concentration of the electric field and the current occurs in the neighborhood of the drain side recess edge and, in this area, generation of the electron-hole pairs caused by collision ionization becomes remarkable.

Although part of the electrons and holes generated flows as the current, part of them is spent for recombination of the electron-holes. As a result, if the recombination occurs at non-luminescence center, then the energy thereof is given to the crystal lattice of the semiconductor, which causes dislocation or proliferation of the defects in the crystal with the result that degradation of the characteristics of FET (reduction of the drain current) occurs.

Further, in the foregoing conventional structure shown in FIG. 2 in which the impurity density of a part of the semiconductor layer in the neighborhood of the gate electrode is reduced, although the electric field concentration in the neighborhood of the gate electrode, which occurs when the gate voltage is low, is alleviated, when the drain voltage is high, it does not lend itself to the electric field alleviation at the drain side recess edge.

As described above, in the conventional recessed type semiconductor device, when the drain voltage is very high, concentration of the electric field and the current at the recess edge cannot be alleviated, and the degradation of the characteristics caused by the collision ionization cannot be prevented.

SUMMARY OF THE INVENTION

The present invention was conceived in order to solve the foregoing problem and the object thereof is to provide a semiconductor device which, when the drain voltage is very high, can alleviate the concentration of the electric field and the current at the recess edge and can prevent the degradation of the characteristics caused by the collision ionization.

In order to achieve the foregoing object, the present invention provides a semiconductor device in which an active layer is formed on a semiconductor substrate, a gate electrode is formed on the active layer, a first high density impurity layer is formed on the active layer at one of the areas at both sides sandwiching the gate electrode separated from the gate electrode, a second high density impurity layer is formed on the other separated from the gate electrode, a source electrode is formed on the first high density impurity layer, a drain electrode is formed on the second high density impurity layer, and an edge portion semiconductor layer having an impurity density lower than that of the second high density impurity layer is disposed adjacent to an edge of the second impurity layer at the side of the gate electrode.

In an aspect of the present invention, the semiconductor substrate has a resistance higher than that of the active layer.

In an aspect of the present invention, the source electrode is disposed at a position where it is separated from the edge of the first high density impurity layer at the side of the gate electrode, and the drain electrode is disposed at a position where the drain electrode is separated from the edge of the second high density impurity layer at the side of the gate electrode.

In an aspect of the present invention, the active layer has a recessed structure in which the thickness of an area in the neighborhood of the gate electrode is thinner than that of another area where the first high density impurity layer and the second high density impurity layer are formed.

In an aspect of the present invention, either of the electrical conductivity types of the active layer, the first high density impurity layer, the second high density impurity layer and the edge portion semiconductor layer is of n-type material.

In an aspect of the present invention, the semiconductor substrate is made of GaAs, the active layer comprises an n-type GaAs layer epitaxially grown on the semiconductor substrate, and the first and second high density impurity layers each are a contact layer comprising an n⁺-type GaAs epitaxially grown on the active layer.

In an aspect of the present invention, an additional edge portion semiconductor layer having an impurity density lower than that of the first high density impurity layer is disposed adjacent to an edge of the first impurity layer at the side of the gate electrode.

The semiconductor substrate may be made of InP.

The impurity density in the active layer is, for example, $1\times10^{27}$ to $3\times10^{17}$ cm$^{-3}$.

The impurity density in the first and second high density impurity layers is, for example, $4\times10^{17}$ to $1\times10^{18}$ is cm$^{-3}$.

The impurity density in the edge portion semiconductor layer and the additional edge portion semiconductor layer is, for example, $2\times10^{17}$ to $4\times10^{17}$ cm$^{-3}$ and is preferably higher than that of the active layer.

The electrical conductivity type of the active layer, the first and second high density impurity layers, the edge portion semiconductor layer and the additional edge portion semiconductor layer may be of p-type material.

According to the present invention, there is provided a recess type semiconductor device in which an active layer (n-type layer) is provided on a high resistance semiconductor substrate, a pair of contact layers (n⁺-type layers) is provided thereon, a source electrode is provided on one of the contact layers (n⁺-type layers), a drain electrode is provided on the other contact layer (n⁺-type layer) and a gate electrode is provided on the foregoing active layer (n-type layer), characterized in that a semiconductor layer (n⁻-type layer) having a lower impurity density than the contact layer (n⁺-type layer) provided at the recess edge portion of the source side contact layer and drain side contact layer or at least at the recess edge portion of the drain side contact layer.

As a method for manufacturing the above semiconductor device, there is one comprising a first process of selectively etching an active layer (n-type layer) and a contact layer (n³⁰-type layer), which are epitaxially grown sequentially on the foregoing high resistance semiconductor substrate, with the pair of contact layers (n⁺-type layers) left to form a recess structure; a second process of epitaxially growing a semiconductor layer (n⁻-type layer) having a lower impurity density than that of the contact layer (n⁺-type layer) on the active layer and the contact layer; a third process of selectively leaving the semiconductor layer (n⁻-type layer) at the recess edge portion of the foregoing source and drain side contact layers or only at the recess edge portion of at least the drain side contact layer to remove the other part of the semiconductor layer (n⁻-type layer); and a fourth process of disposing a source electrode on one contact layer (n⁻-type layer) and a drain electrode on the other and disposing a gate electrode on the active layer (n-type layer) therebetween.

Another manufacturing method comprises a first process of irradiating plasma to a portion of the contact layer (n⁺-type layer) which is epitaxially grown on the active layer (n-type layer), which is epitaxially grown on the high resistance semiconductor substrate, to lower an impurity density of the contact layer (n⁺-type layer); a second process of removing part of the portion of the contact layer where the impurity density has been reduced in the first process by etching to leave a pair of contact layers (n⁺-type layers) to form a recessed structure including the recess edge portion (n⁻-type layer) of lowered impurity density; and a third process of disposing a source electrode on one of the pairs of contact layers (n⁺-type layer), disposing a drain electrode on the other and disposing a gate electrode on the active layer (n-type layer) therebetween.

In the foregoing semiconductor device according to the present invention, when the drain voltage is high, concentration of the electric field and the current is alleviated by the semiconductor layer (n⁻-type layer) low in carrier or impurity density which is formed at the drain side recess edge portion, and thus the generation of the electron-hole pair caused by collision ionization is suppressed with the result that the damage to the crystal lattice by the recombination of the electron-holes at non-luminescence centers is reduced and the dislocation or proliferation of the defects can be suppressed, so that the degradation of the characteristics of the device can be prevented.

DESCRIPTION OF THE PREFERRED EMBODIMENTS

Some specific embodiments are hereinafter described with reference to the accompanying drawings.

FIGS. 3A through 3D each illustrate a structure and a manufacturing method of a first embodiment according to the present invention.

Figure 1:
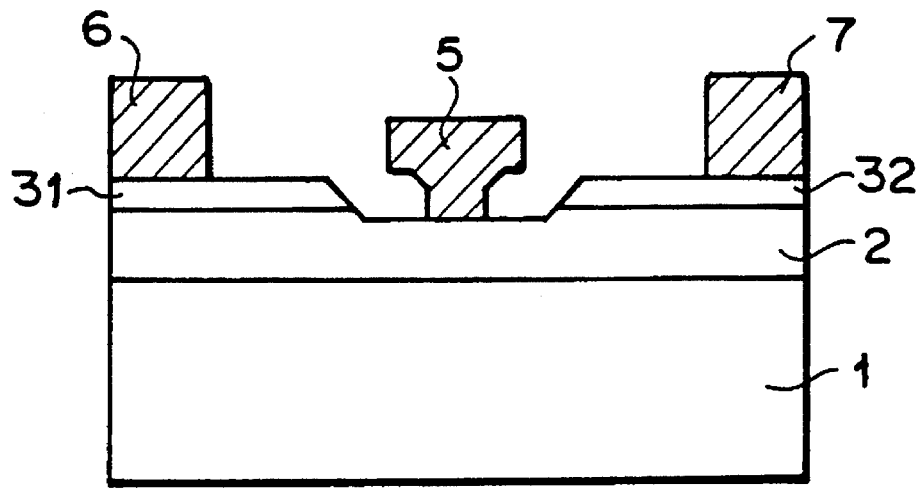
FIG. 1 is a view illustrating a conventional MESFET structure.
Figure 2:
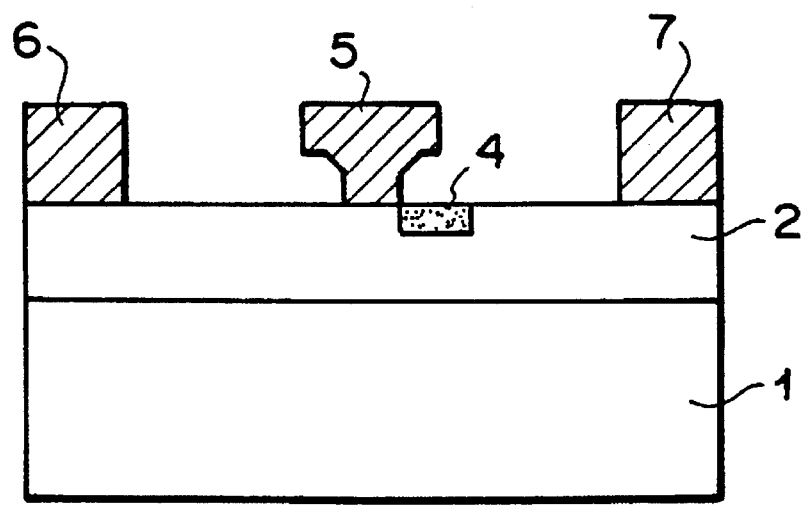
FIG. 2 is a view illustrating another conventional MESFET structure.
Figure 3A:
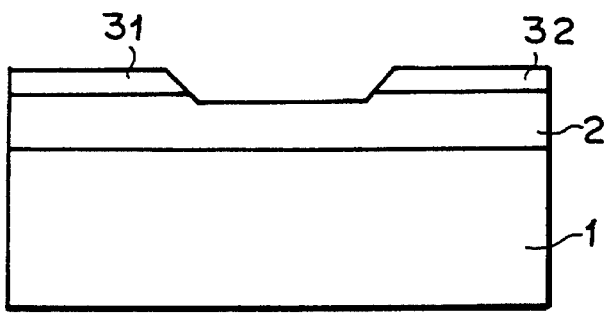
FIGS. 3A through 3D are respectively a view illustrating a semiconductor device of MESFET structure and a manufacturing method therefor according to a first embodiment of the present invention.

First, as shown in FIG. 3A, an epitaxially grown GaAs active layer (n-type layer: impurity density $2\times10^{17}$ cm$^{-3}$) 2 and an epitaxially grown GaAs contact layer (n⁺-type layer: impurity density $5\times10^{17}$ cm$^{-3}$), which are sequentially grown on a high resistance GaAs substrate 1, are selectively etched to leave a pair of contact layers (n⁺-type layers) 31, 32 to form a recessed structure.

Figure 3B:
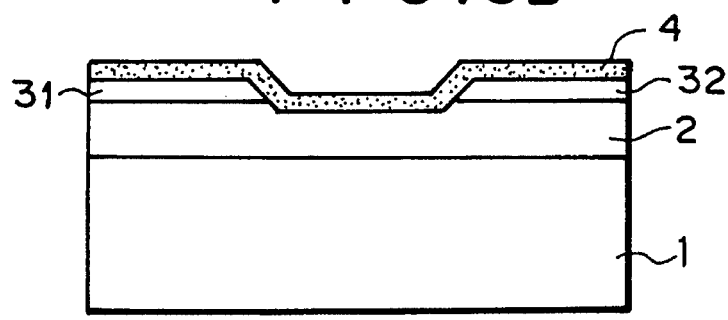

Next, as shown in FIG. 3B, a GaAs layer (n⁻-type layer: impurity density $3\times10^{17}$ cm$^{-3}$) 4 lower in impurity density than that of the contact layers (n⁺-type layers) 31, 32 is epitaxially grown.

Figure 3C:
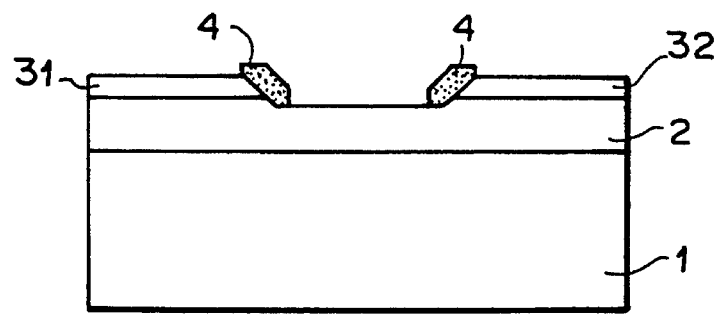

Thereafter, as shown in FIG. 3C, only the recess edge portion are masked with a resist pattern to leave a portion of the GaAs layer (n⁻-type layer) selectively and to remove the other portion of the GaAs layer (n⁻-type layer) by dry etching using a chloric gas.

Figure 3D:
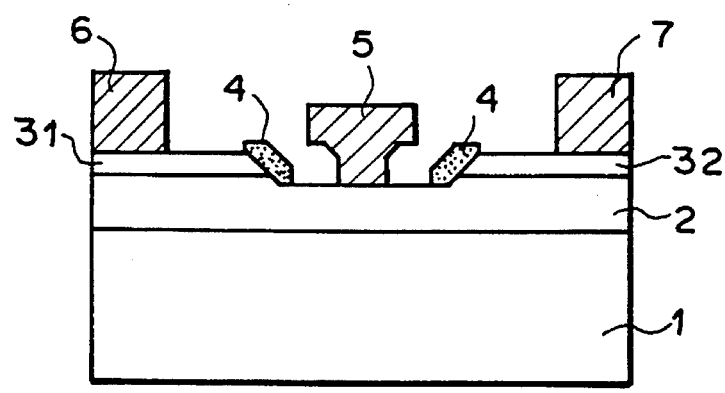

Then, as shown in FIG. 3D, a gate electrode 5, a source electrode 6 and a drain electrode 7 are formed.

In the MESFET formed through the foregoing processes, the strong electric field portion of the drain side recess edge spreads over the entire area of the n⁻-type layer, and correspondingly the maximum intensity thereof is reduced. As the result of dispersed electric line of force, the area where the large electric current flows is also dispersed, and the generation of the electron-holes pairs caused by the collision ionization is suppressed to a fraction of the conventional one.

Figure 4A:
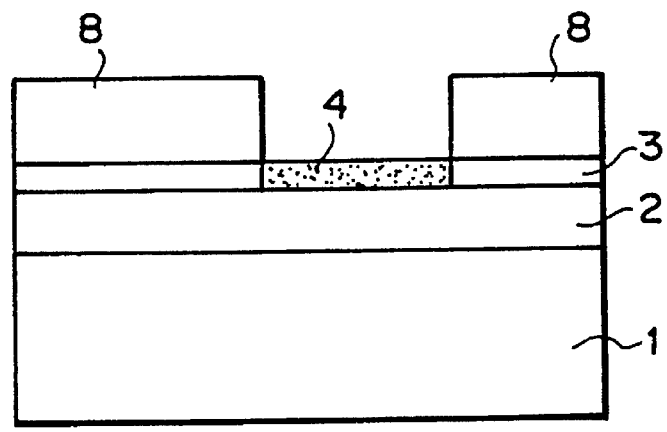
FIGS. 4A through 4C respectively a view illustrating a semiconductor device of MESFET structure and a manufacturing method therefor according to a second embodiment of the present invention.
Figure 4B:
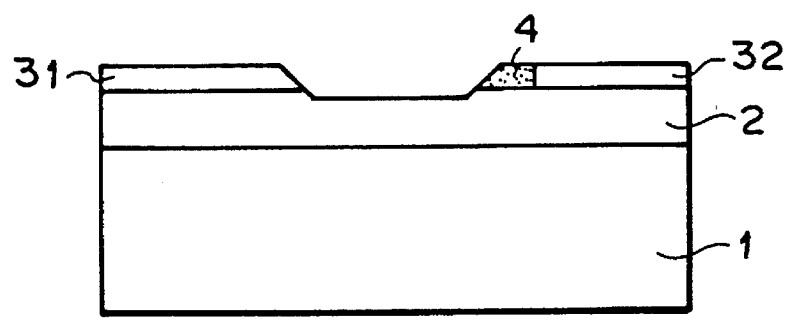
Figure 4C:
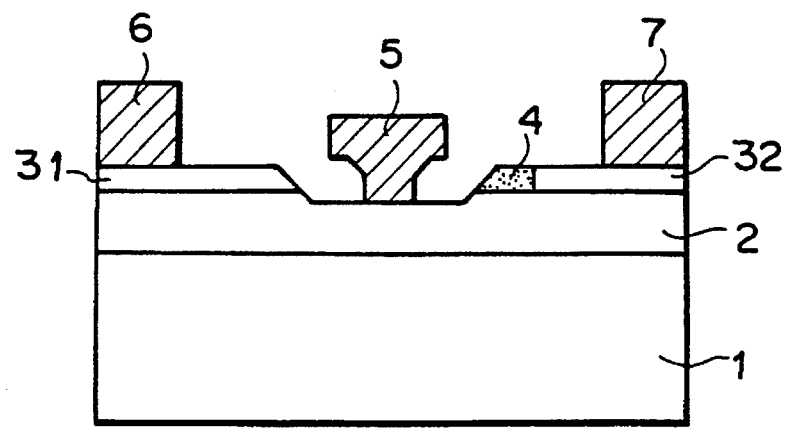

FIGS. 4A through 4C each illustrate a structure and a manufacturing method according to a second embodiment of the present invention.

First, as shown in FIG. 4A, according to a conventional lithographic technique, a pattern of resist 8 is formed on a GaAs contact layer ($n^+$-type layer) 3 which is epitaxially grown on a GaAs active layer (n-type layer) 2 which is epitaxially grown on a high resistance GaAs substrate 1, damage is imparted to the exposed portion of the contact layer ($n^+$-type layer) 3 by irradiating plasma using $SF_6$ or $CF_4$ gases, and a GaAs layer ($n^-$-type layer) 4 having a substantially lowered impurity density is formed there. The active layer 2, contact layer 3 and the layer 4 each have the impurity density similar to the corresponding one of the first embodiment.

Next, as shown in FIG. 4B, recess etching is conducted so that a portion of the GaAs layer ($n^-$-type layer) 4 serves as the drain side recess edge.

Finally, as shown in FIG. 4C, the gate electrode 5, source electrode 6 and the drain electrode 7 are disposed.

Thus, the MESFET is obtained having a similar recessed structure as that of the first embodiment. Also in the second embodiment, of course, the similar effect as in the first embodiment can be obtained.

In either embodiment, if the drain voltage is high, the concentration of the electric field and the current is alleviated at the drain side recess edge portion, and the generation of the electron-holes due to the collision ionization is suppressed. Therefore, the damage to the crystal lattice by the non-luminescence recombination of the electron-holes is reduced, and the dislocation or proliferation of the defects is suppressed thus preventing the degradation of the FET characteristics.

As described above, according to the present invention, it is possible to provide a semiconductor device which when the drain voltage is very high allows the concentration of the electric field and current to the recess edge to be alleviated to prevent the degradation of the characteristics of the device due to the collision ionization.

Incidentally, the present invention is not restricted to the foregoing embodiments, but can be practiced even if it is modified in various manners within the scope of the present invention.

What is claimed is:

1. A semiconductor device comprising:

a semiconductor substrate;

an active layer formed on said semiconductor substrate, said active layer having a first area, a second area and a recessed area of a reduced thickness positioned between said first and second areas, a surface of the recessed area being lower than that of the first and second areas;

a gate electrode formed on the surface of said recessed area of the active layer at a central portion thereof;

a first high density impurity layer formed on a surface of said first area of the active layer;

a second high density impurity layer formed on a surface of said second area of the active layer;

a source electrode formed on said first high density impurity layer, said source electrode being disposed at an area away from an edge of said first high density impurity layer at a side of said recessed area;

a drain electrode formed on said second high density impurity layer, said drain electrode being disposed at an area away from an edge of said second high density impurity layer at a side of said recessed area;

an edge portion semiconductor layer having an impurity density lower than that of said second high density impurity layer, said edge portion semiconductor layer being disposed on said active layer at a position adjacent to the edge of said second high density impurity layer at the side of said recessed area; and an additional edge portion semiconductor layer having an impurity density lower than that of said first high density impurity layer disposed on said active layer at a position adjacent to an edge of said first high density impurity layer at the side of said recessed area.

2. A semiconductor device as set forth in claim 1, wherein said semiconductor substrate has a resistance higher than that of said active layer.

3. A semiconductor device as set forth in claim 1, wherein said active layer, said first high density impurity layer, said second high density impurity layer and said edge portion semiconductor layer have an electrical conduction of n-type.

4. A semiconductor device as set forth in claim 1, wherein said semiconductor substrate is made of GaAs, said active layer comprises an n-type GaAs layer epitaxially grown on said semiconductor substrate, and said first and second high density impurity layers each are a contact layer comprising an $n^+$-type GaAs layer epitaxially grown on said active layer.

* * * * *